United States Patent [19]
Hashimoto et al.

[11] Patent Number: 5,863,988
[45] Date of Patent: Jan. 26, 1999

[54] LIQUID ADHESIVE FOR ELECTRONIC PARTS AND ADHESIVE TAPE

[75] Inventors: Takeshi Hashimoto; Katuji Nakaba; Jun Tochihira, all of Shizuoka, Japan

[73] Assignee: Tomoegawa Paper Co., Ltd., Tokyo, Japan

[21] Appl. No.: 768,392

[22] Filed: Dec. 18, 1996

[30] Foreign Application Priority Data

Dec. 25, 1995 [JP] Japan ..................................... 7-351086
Jun. 12, 1996 [JP] Japan ..................................... 8-172946

[51] Int. Cl.$^6$ ....................................................... C08F 8/00
[52] U.S. Cl. ........................... 525/105; 524/508; 524/509; 524/588; 525/132; 525/134; 427/387; 428/447
[58] Field of Search ..................................... 525/105, 132, 525/134, 479; 524/588, 508, 509; 427/387; 428/447

[56] References Cited

U.S. PATENT DOCUMENTS 5,523,137  6/1996  Sei et al. ............................... 428/473.5

*Primary Examiner*—Melvyn I. Marquis
*Attorney, Agent, or Firm*—Wenderoth, Lind & Ponack, L.L.P.

[57] ABSTRACT

An adhesive for electronic parts, which can be used for bonding and cured at a relatively low temperature and has sufficient heat resistance and reliability, and an adhesive tape for electronic parts, for which the above adhesive is adapted, the adhesive being a liquid adhesive obtained by dissolving an acrylonitrile-butadiene copolymer as Component (a), a phenolic resin as Component (b), a compound having at least 2 maleimide groups as Component (c) and a diamine compound of the general formula (1) specified in claim 1, and/or a polysiloxane compound terminating with an amino group at each terminal, having a weight average molecular weight of 200 to 7,000 and having the general formula specified in claim 1, as Component (d) in an organic solvent, and in which the total amount of Components (b), (c) and (d) per 100 parts by weight of Component (a) is 10 to 900 parts by weight, the amount of Component (b) based on the total amount of Components (b), (c) and (d) is 10 to 90% by weight, and the amount of amino groups of Component (d) per mole equivalent of the maleimide groups of Component (c) is 0.01 to 2.0 mole equivalents.

10 Claims, 2 Drawing Sheets

LIQUID ADHESIVE FOR ELECTRONIC PARTS AND ADHESIVE TAPE

FIELD OF THE INVENTION

The present invention relates to a liquid adhesive for electronic parts, which is used for bonding one member to another member of lead frame peripheral parts which constitute a semiconductor device, such as a lead pin, a semiconductor chip mounting substrate, a radiator, a semiconductor chip itself, and the like, and an adhesive tape.

PRIOR ART OF THE INVENTION

Among conventional adhesive tapes used in a plastic-sealed semiconductor device are a lead frame fixing tape, a TAB tape, etc. For example, a lead frame fixing adhesive tape is used for fixing lead pins of a lead frame so that it serves to improve the yield and the productivity of lead frames per se and the entire semiconductor assembly steps. Generally, the above fixing adhesive tape is taped on a lead frame by a lead frame manufacturer and shipped to a semiconductor manufacturer. In the semiconductor manufacturer, IC is mounted thereon and sealed with a resin. The lead frame fixing tape is therefore required not only to have general reliability in a semiconductor level and workability at a taping time, but also to have adhesion strength at room temperature immediately after taping and heat resistance sufficient for enduring heat applied in the step of assembling a semiconductor device.

As an adhesive tape for the above use, for example, there is used an adhesive tape which is prepared by applying a synthetic rubber-based resin such as polyacrylonitrile, polyacrylate ester or a acrylonitrile-butadiene copolymer, an adhesive obtained by modifying the above synthetic rubber-based resin with other resin or a mixture of the above synthetic rubber-based resin with other resin onto a substrate film such as a polyimide film, and B-staging it.

Specifically, JP-A-2-14597 discloses a copper-clad film for a semiconductor circuit, which has an adhesive layer containing, as main ingredients, an epoxy resin, an acrylonitrile-butadiene copolymer resin and a phenolic resin applied to a substrate surface. JP-A-2-91177 and JP-A-2-133483 disclose an adhesive tape for electronic parts, which has an adhesive layer formed from an acrylonitrile-butadiene copolymer and a resol-type phenolic resin applied to a heat-resistant film surface. JP-A-3-64387 discloses an adhesive tape for electronic parts, which has an adhesive layer containing an acrylonitrile-butadiene copolymer, a resol-type phenolic resin and an epoxy resin applied to a heat-resistant film surface.

In recent years, plastic-sealed semiconductor devices (semiconductor package) having structure as shown in FIGS. 1 to 4 have been developed. The plastic-sealed semiconductor device shown in FIG. 1 has a structure in which a lead pin 3 is connected to a plane 2 with an adhesive layer 6, a semiconductor chip 1 is mounted on the plane 2 and a bonding wire 4 connecting the semiconductor chip 1 and the lead pin 3 and the plane 2 are together sealed with a resin 5. The device shown in FIG. 2 has a structure in which a lead pin 3 and a semiconductor chip 1 are fixed with an adhesive layer 6 and these parts are sealed with a resin 5 together with a bonding wire 4. The device shown in FIG. 3 has a structure in which a semiconductor chip 1 is mounted on a die pad 7, an electrode 8 is fixed with an adhesive layer 6, the semiconductor chip 1 is connected to the electrode 8 with a bonding wire 4, the electrode 8 is connected to a lead pin 3 with a bonding wire 4 and these parts are sealed with a resin 5. The device shown in FIG. 4 has a structure in which a semiconductor chip 1 is mounted on a die pad 7, the semiconductor chip 1 is connected to a lead pin 3 with a bonding wire 4, lead pins 3 are fixed with an adhesive layer 6 and a heat-resistant film 9, and these parts are sealed with a resin 5.

However, the above adhesives and adhesive tapes using the above adhesives generate gas in a wire bonding step in the production of a semiconductor device and pollute a bonding apparatus. The problem is therefore that a step of washing the bonding apparatus is required.

An adhesive tape prepared by applying a conventional adhesive has a problem that its heat resistance is insufficient when it is used as an adhesive layer in the plastic-sealed semiconductor devices shown in the above FIGS. 1 to 4. When a polyimide resin is used, the polyimide resin requires a high taping temperature, a high pressure, a strong curing condition, etc., so that it may damage metal parts such as a lead frame. It is therefore desired to develop an adhesive which can be used for bonding and cured at a relatively low temperature and has sufficient heat resistance and reliability. The "reliability" means that it causes neither a leak nor a short circuit of current under the conditions of PCBT (pressure cooker biased test) to be described later.

SUMMARY OF THE INVENTION

It is an object of the present invention to provide an adhesive for electronic parts, which can be used for bonding and cured at a relatively low temperature and has sufficient heat resistance and reliability, and an adhesive tape for electronic parts, for which the above adhesive is adapted.

It is another object of the present invention to provide an adhesive for electronic parts, which is free from generating a gas in a wire bonding step, and an adhesive tape for electronic parts, for which the above adhesive is adapted.

The present invention 1 provides an adhesive for electronic parts, which is a liquid adhesive obtained by dissolving an acrylonitrile-butadiene copolymer as Component (a), a phenolic resin as Component (b), a compound having at least 2 maleimide groups as Component (C) and a diamine compound of the general formula (1),

wherein $R^1$ is a divalent aliphatic, aromatic or alicyclic group and/or a polysiloxane compound terminating with an amino group at each terminal, having a weight average molecular weight of 200 to 7,000 and having the general formula (2),

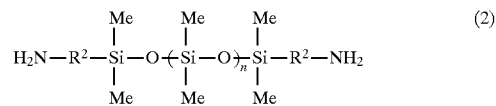

wherein $R^2$ is a divalent aliphatic, aromatic or alicyclic group and n is an integer of 0 to 7, as Component (d) in an organic solvent, and in which the total amount of Components (b), (c) and (d) per 100 parts by weight of Component (a) is 10 to 900 parts by weight, the amount of Component (b) based on the total amount of Components (b), (c) and (d) is 10 to 90% by weight, and the amount of amino groups of Component (d) per mole equivalent of the maleimide groups of Component (c) is 0.01 to 2.0 mole equivalents.

The present invention 2 provides an adhesive for electronic parts, which is a liquid adhesive containing an epoxy resin further as Component (e) in addition to Components used in the present invention 1, and in which the total amount of Components (b), (c), (d) and (e) per 100 parts by weight of Component (a) is 10 to 900 parts by weight, the total amount of Components (b) and (e) based on the total amount of Components (b), (c), (d) and (e) is 10 to 90% by weight, and the amount of amino groups of Component (d) per mole equivalent of the maleimide groups of Component (c) is 0.01 to 2.0 mole equivalents.

The present invention 3 provides an adhesive tape for electronic parts, which is formed by laminating an adhesive layer formed from one of the above liquid adhesives on at least one surface of a heat-resistant film.

The present invention 4 provides an adhesive tape for electronic parts, which is formed by laminating an adhesive layer formed from one of the above liquid adhesives on at least one surface of a detachable film.

The present invention 5 provides a method of using the above liquid adhesive for fixing a lead frame.

The present invention 6 provides a method of using the above adhesive tape for fixing a lead frame.

DETAILED DESCRIPTION OF THE INVENTION

Figure 1:
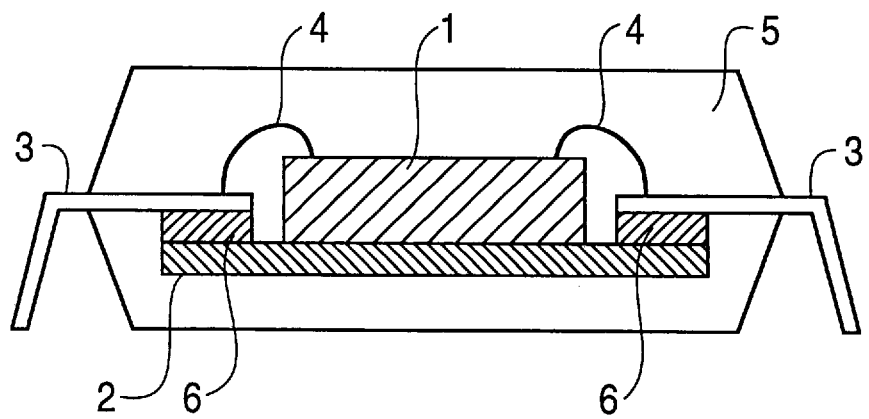
FIG. 1 is across-sectional view of a plastic-sealed semiconductor device to which the adhesive tape of the present invention or a conventional adhesive tape is applied.

The present invention will be explained in detail hereinafter.

The liquid adhesive according to the present invention 1 is composed of (a) an acrylonitrile-butadiene copolymer, (b) aphenolicresin, (c) a compound having at least 2 maleimide groups and (d) a diamine compound and/or a polysiloxane compound terminating with an amino group at each terminal and having a weight average molecular weight of 200 to 7,000.

The acrylonitrile-butadiene copolymer can be selected from known acrylonitrile-butadiene copolymers. An acrylonitrile-butadiene copolymer having a weight average molecular weight 50,000 to 1,000,000 and an acrylonitrile content of 5 to 50% by weight is preferred, and an acrylonitrile-butadiene copolymer having a weight average molecular weight 100,000 to 500,000 and an acrylonitrile content of 10 to 40% by weight is particularly preferred. When the weight average molecular weight of the acrylonitrile-butadiene copolymer is lower than the above lower limit, undesirably, the liquid adhesive is poor in heat stability and its heat resistance decreases. When the above weight average molecular weight is higher than the above upper limit, undesirably, the adhesive is poor in workability and adhesion property due to a decrease in the solubility in a solvent and an increase in melt viscosity. When the content of the acrylonitrile content is smaller than the above lower limit, undesirably, the solubility of the adhesive in a solvent decreases. When the above content is greater than the above upper limit, undesirably, the adhesive is unstable in insulating property.

The phenolic resin can be selected from known phenolic resins, while it is preferably selected from a p-tert-butylphenol type phenolic resin, a bisphenol A type phenolic resin or a cresol type phenolic resin of which the phenol component is at least one selected from the group consisting of p-tert-butylphenol, bisphenol A and cresol, or a resol type phenolic resin obtained by co-condensation of these, since the adhesion temperature and the curing temperature o+f the adhesive can be decreased and since sufficient adhesion strength can be obtained.

The compound having at least 2 maleimide groups can be selected from known ones, while compounds of the following formulae (3-1) to (3-6) are particularly preferred in view of electric reliability and solubility in a solvent. These compounds are generally commercially and easily available. Further, these compounds can be synthesized by a known method.

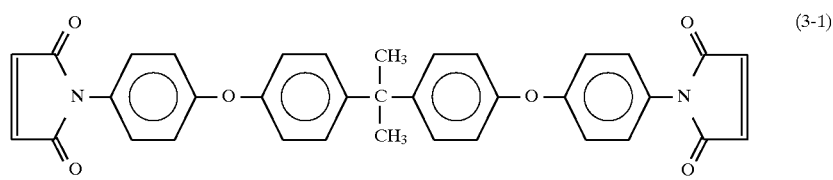

(3-1)

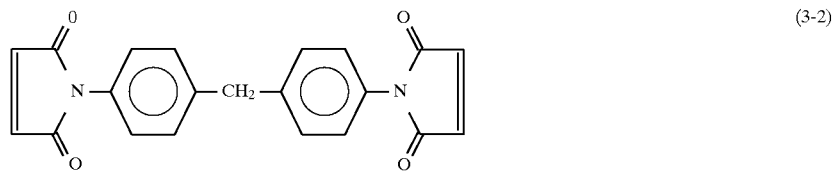

(3-2)

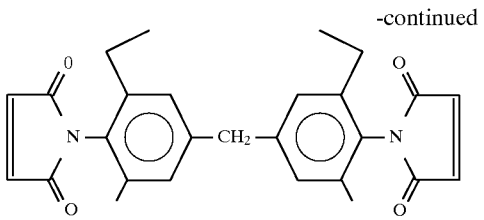
(3-3)

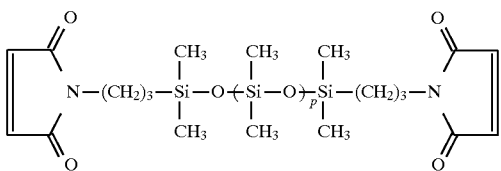
(3-4)

in which p is an integer of 0 to 7.

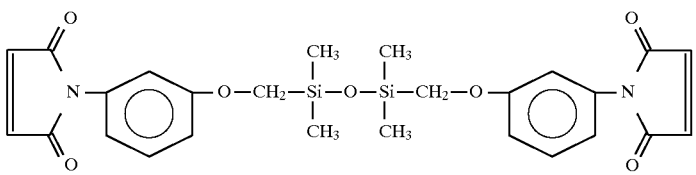
(3-5)

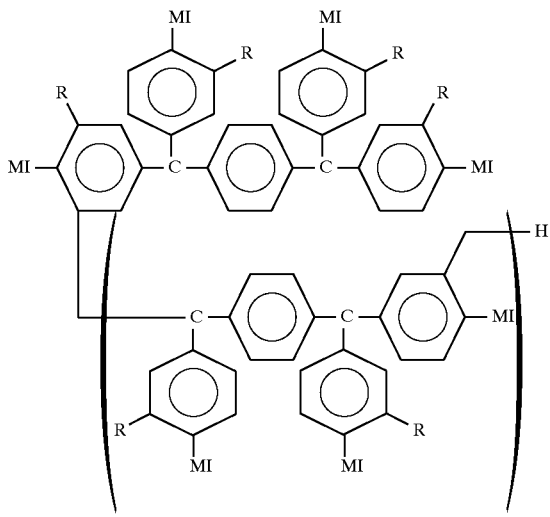
(3-6)

in which

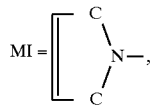

R=H or CH$_3$, and r=1~5.

Examples of the diamine compound of the general formula (1) used as Component (d) are as follows.

3,3'-diaminobiphenyl, 3,4'-diaminobiphenyl, 4,4'-diaminobiphenyl, 3,3'-diaminodiphenylmethane, 3,4'-diaminodiphenylmethane, 4,4'-diaminodiphenylmethane, 2,2(3,3'-diaminodiphenyl)propane, 2,2-(3,4'-diaminodiphenyl)propane, 2,2-(4,4'-diaminodiphenyl)propane, 2,2-(3,3'-diaminodiphenyl)hexafluoropropane, 2,2-(3,4'-diaminodiphenyl)hexafluoropropane, 2,2-(4,4'-diaminodiphenyl)hexafluoropropane, 3,3'-oxydianiline, 3,4'-oxydianiline, 4,4'-oxydianiline, 3,3'-diaminodiphenylsulfide, 3,4'-diaminodiphenylsulfide, 4,4'-diaminodiphenylsulfide, 3,3'-diaminodiphenylsulfone, 3,4'-diaminodiphenylsulfone, 4,4'-diaminodiphenylsulfone, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 3,3'-bis(3-aminophenoxy)diphenyl ether, 3,3'-bis(4-aminophenoxy)diphenyl ether, 3,4'-bis(3-aminophenoxy)diphenyl ether, 3,4'-bis(4-aminophenoxy) diphenyl ether, 4,4'-bis(3-aminophenoxy)diphenyl ether, 4,4'-bis(4-aminophenoxy)diphenyl ether, 1,4-bis[1-(4-aminophenyl)-1-methylethyl-bis(3-aminophenoxy) biphenyl, 3,3'-bis(4-aminophenoxy)biphenyl, 3,4'-bis(3-aminophenoxy)biphenyl, 3,4'-bis(4-aminophenoxy) biphenyl, 4,4'-bis(3-aminophenoxy)biphenyl, 4,4'-bis(4-aminophenoxy)biphenyl, bis[4-(3-aminophenoxy)phenyl] sulfone, bis[4-(4-aminophenoxy)phenyl]sulfone, 2,2-bis[3-(3-aminophenoxy)phenyl]propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4-aminophenoxy)phenyl]hexafluoropropane, 2,2-bis[4-(3- aminophenoxy)phenyl]hexafluoropropane, 2,2-bis[4-(4-aminophenoxy)phenyl]hexafluoropropane, 9,9-bis(3-aminophenyl)fluorene and 9,9-bis(4-aminophenyl)fluorene.

The polysiloxane compound terminating with an amino group at each terminal and having a weight average molecular weight of 200 to 7,000 includes bis(3-aminopropyl) tetramethyldisiloxane, dimethylsiloxane tetramer and octamer terminating with aminopropyl groups, and bis(3-aminophenoxymethyl)tetramethyldisiloxane. These compounds may be used alone or in combination.

According to the present invention 2, the above liquid adhesive may further contain an epoxy resin as Component (e). The epoxy resin is selected from known epoxy resins such as glycidyl ether-containing, glycidyl ester-containing, glycidylamine-containing, alicyclic and heterocyclic epoxy resins. In view of heat resistance, toughness and high adhesion properties, it is preferred to use an epoxy resin having a novolak, bisphenol or biphenyl structure. Further, the above epoxy resin as Component (e) may be selected from resins of which the molecular structure contains an epoxy group.

The amounts of the above Components are set such that the total amount of Components (b), (c) and (d) per 100 parts by weight of Component (a) is 10 to 900 parts by weight, preferably 20 to 800 parts by weight. When the total amount of Components (b), (c) and (d) is smaller than the above lower limit, the adhesive after being applied and cured shows an extreme decrease in heat resistance, Tg and Young's modulus, shows poor surface tackiness and is therefore not suitable for the intended use. When the above total amount exceeds the above upper limit, the adhesive layer becomes fragile when cured to a B-stage, which causes poor workability, and the adhesion of the adhesive layer to a heat-resistant film becomes poor. In view of workability and the properties of a cured resin, the amount of Component (b) based on the total amount of Components (b), (c) and (d) is 10 to 90% by weight. Further, the amounts of Components (c) and (d) are required to be set such that the amount of amino groups of Component (d) per mole equivalent of maleimide groups of Component (c) is 0.01 to 2.0 mole equivalents, preferably 0.1 to 1.0 mole equivalent. When the equivalent weight of amino groups of Component (d) is smaller than the above lower limit, the adhesive layer becomes fragile when cured to a B-stage, which causes poor workability, and the adhesion of the adhesive layer to a heat-resistant film becomes poor. When the above equivalent weight of amino groups exceeds the above upper limit, Components cause gelation and an adhesive can be no longer prepared.

In the present invention 2, Component (e) can be incorporated as a substitute for part of Component (b). Therefore, the total amount of Components (b) and (e) based on the total amount of Components (b), (c), (d) and (e) is 10 to 90% by weight as well as in the present invention 1. The amount ratio of Component (b) and Component (e) is determined depending upon the numbers of functional groups, while these components (b) and (e) may be in any amount ratio when a reaction promoter to be described later is used in combination. When the amount of Component (b) is smaller than 10% by weight, or when the total amount of Components (b) and (e) is smaller than 10% by weight, undesirably, the adhesion strength of the adhesive to a heat-resistant film is low. When the above amount or total amount is greater than 90% by weight, undesirably, voids are formed.

Components (a), (b), (c) and (d) and optionally Component (e) are mixed in a solvent which can dissolve these Components. The solvent includes N-methyl-2-pyrrolidone, N,N-dimethylacetamide, N,N-dimethylformamide, dimethyl sulfoxide, sulfolane, hexamethylphosphoric acid triamide, 1,3-dimethyl-2-imidazolidone, hexane, benzene, toluene, xylene, methyl ethyl ketone, acetone, diethyl ether, tetrahydrofuran, dioxane, 1,2-dimethoxyethane, diethylene glycol dimethyl ether, methyl cellosolve, cellosolve acetate, methanol, ethanol, propanol, isopropanol, methyl acetate, ethyl acetate, acetonitrile, methylene chloride, chloroform, carbon tetrachloride, chlorobenzene, dichlorobenzene, dichloroethane, dichloroethane and trichloroethane. The solvent is selected in kind and amount such that each Component is dissolved.

The liquid adhesive may contain a reaction promoter as required for promoting a reaction at a drying or heat-curing time. The reaction promoter includes organic peroxides such as diazabicyclooctane, methyl ethyl ketone peroxide, cyclohexane peroxide, 3,3,5-trimethylcyclohexanone peroxide, methylcyclohexanone peroxide, methyl acetoacetate peroxide, acetyl acetone peroxide, 1,1-bis(tert-butylperoxy)-3,3,5-trimethylhexane, 1,1-bis(tert-butylperoxy) cyclohexane, 2,2-bis(tertbutylperoxy)octane, n-butyl-4,4-bis(tert-butylperoxy)valerate, 2,2-bis(tert-butylperoxy) butane, tert-butylhydroperoxide, cummene hydroperoxide, diisopropylbenzene hydroperoxide, p-menthane hydroperoxide, 2,5-dimethylhexane-2,5-dihydroperoxide, 1,1,3,3-tetramethylbutyl hydroperoxide, di-tert-butyl hydroperoxide, tert-butylcumyl peroxide, di-cumyl peroxide, α,α'-bis(tert-butylperoxy-m-isopropyl)benzene, 2,5-dimethyl-2,5-di(tert-butylperoxy)hexane, 2,5-dimethyl-2,5-di(tert-butylperoxy)hexyne, acetyl peroxide, isobutyl peroxide, octanoyl peroxide, decanoyl peroxide, benzoyl peroxide, lauroyl peroxide, 3,5,5-trimethylhexanoyl peroxide, succinic acid peroxide, 2,4-dichlorobenzoyl peroxide, m-toluyl peroxide, diisopropylperoxydicarbonate, di-2-ethylhexylperoxydicarbonate, di-n-propylperoxydicarbonate, bis(4-tert-butylcyclohexyl) peroxydicarbonate, dimyristylperoxydicarbonate, di-2-ethoxyethylperoxydicarbonate, dimethoxyisopropylperoxydicarbonate, di-(3-methyl-3-methoxybutyl)peroxydicarbonate, di-allylperoxydicarbonate, tert-butylperoxyacetate, tert-butylperoxyisobutylate, tert-butylperoxypivalate, tert-butylperoxyneodecanoate, cumylperoxyneodecanoate, tert-butylperoxy-2-ethylhexanoate, tert-butylperoxy-3,5,5-trimethylhexanoate, tert-butylperoxylaurate, tert-butylperoxybenzoate, di-tert-butylperoxyisophthalate, 2,5-dimethyl-2,5-di(benzoylperoxy)hexane, tert-butylperoxymaleic acid, tert-butylperoxyisopropyl carbonate, cumylperoxyoctate, tert-hexylperoxyneodecanoate, tert-hexylperoxypivalate, tert-butylperoxyneohexanoate, acetylcyclohexylsulfonyl peroxide and tert-butyloxyallylcarbonate; imidazoles such as 1,2-dimethylimidazole, 1-methyl-2-ethylimidazole, 2-methylimidazole, 2-ethyl-4-methylimidazole, 2-undecylimidazole, 2-heptadecylimidazole, 2-phenylimidazole, 1-benzyl-2-methylimidazole, 1-benzyl-2-phenylimidazole, 1-benzyl-2-phenylimidazole trimellitic acid salt, 1-benzyl-2-ethylimidazole, 1-benzyl-2-ethyl-5-methylimidazole, 2-ethylimidazole, 2-isopropylimidazole, 2-phenyl-4-benzylimidazole, 1-cyanoethyl-2-methylimidazole, 1-cyanoethyl-2-ethyl-4-methylimidazole, 1-cyanoethyl-2-undecylimidazole, 1-cyanoethyl-2-isopropylimidazole, 1-cyanoethyl-2-phenylimidazole, 1-cyanoethyl-2-methylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4-methylimidazolyl-(1')]-ethyl-s- triazine, 2,4-diamino-6-[2'-undecylimidazolyl-(1')]-ethyl-s-triazine, 2-methylimidazolium-isocyanuric acid adduct, 2-phenylimidazolium-isocyanuric acid adduct, 2,4-diamino-6-[2'-methylimidazolyl-(1')]-ethyl-s-triazine-isocyanuric acid adduct, 2-phenyl-4,5-dihydroxymethylimidazole, 2-phenyl-4-benzyl-5-hydroxymethylimidazole, 4,4'-methylenebis-(2-ethyl-5-methylimidazole), 1-aminoethyl-2-methylimidazole, 1-cyanoethyl-2-phenyl-4,5-di (cyanoethoxymethyl)imidazole, 1-dodecyl-2-methyl-3-benzylimidazolium chloride, 2-methylimidazole-benzotriazole adduct, 1-aminoethyl-2-ethylimidazole, 1-(cyanoethylaminoethyl)-2-methylimidazole, N,N'-[2-methylimidazolyl-(1)-ethyl]-adipoyldiamide, N,N'-bis-(2-methylimidazolyl-1-ethyl)urea, N-(2-methylimidazolyl-1-ethyl)urea, N,N'-[2-methylimidazolyl-(1)-ethyl] dodecanedioyldiamide, N,N'-[2-methylimidazolyl-(1)-ethyl]eicosanedioyldiamide, 1-benzyl-2-phenylimidazolehydrochloride, and triphenyl phosphine.

The liquid adhesive may further contain a filler having a particle diameter of 1 μm or less for stabilizing taping properties when applied to an adhesive tape. The term "stabilizing taping properties" means preventing the oozing of the adhesive out of side faces of the adhesive tape when the adhesive tape is heat-pressed on a lead and maintaining a proper thickness of an adhesive layer to maintain the property of adhesion. When the above particle diameter exceeds 1 μm, undesirably, the effect on the stabilization of taping properties is small. The amount of the filler based on the total solid content is 4 to 40% by weight, preferably 9 to 24% by weight. When the amount of the filler is smaller than the above lower limit, the effect on the stabilization of taping properties is small. When the above amount exceeds 40% by weight, undesirably, the adhesion strength of the adhesive tape decreases, and the processability such as the formation of a laminate is poor. The filler is selected, for example, from silica, a quartz powder, alumina, calcium carbonate, magnesium oxide, a diamond powder, mica, a fluorine resin or a zircon powder. The above "average particle" diameter is measured by taking an electron microscopic photograph of filler surfaces.

Further, the liquid adhesive may be prepared as one which is isolated after a reaction, washed with an organic solvent, water or a mixture of an organic solvent with water, and re-dissolved in the same organic solvent as above.

The organic solvent used for the above washing is selected from acetone, methyl ethyl ketone, hexane, benzene, toluene, xylene, methanol, ethanol, propanol, diethyl ether, tetrahydrofuran, methyl acetate, ethyl acetate, acetonitrile, methylene chloride, chloroform, carbon tetrachloride, chlorobenzene, dichlorobenzene, dichloroethane or trichloroethane.

The adhesive tape for electronic parts to which the above liquid adhesive is applied, provided by the present invention, will be explained hereinafter.

The adhesive tape of the present invention can be obtained by applying the above liquid adhesive to one surface or both surfaces of a heat-resistant film or to one surface of a detachable film. The thickness of an adhesive layer (applied liquid adhesive) is preferably 5 to 100 μm, particularly preferably 10 to 50 μm. The heat-resistant film includes films of heat-resistant resins such as polyimide, polyphenylene sulfide, polyether, polyparabanic acid and polyethylene terephthalate, and composite heat-resistant films such as epoxy resin-glass cloth and an epoxy resin-polyimide-glass cloth. A film of a polyimide resin is particularly preferred. The thickness of the heat-resistant film is set in the range of from 7.5 to 130 μm, particularly preferably 12.5 to 75 μm. When the thickness is too small, the adhesive tape has an insufficient nerve. When it is too large, it is difficult to punch out the adhesive tape.

The detachable film used for the adhesive tape of the present invention has a thickness of 1 to 200 μm, preferably 10 to 100 μm, and works as a temporary support. The detachable film includes a polypropylene film, a fluorine-resin-containing film, a polyethylene film, a polyethylene terephthalate film and paper. In some cases, these films may be imparted with detachability with a silicone resin.

The detachable film preferably has a 90° peel strength of 0.01 to 7.0 g/cm. When the peel strength is smaller than the above range, the detachable film may be easily detached when the adhesive tape is fed. When the peel strength is larger than the above range, the detachable film is not peeled from the adhesive layer clean, and the workability is poor.

Further, when the liquid adhesive is applied to one surface or both surfaces of the heat-resistant film for forming adhesive layer(s), a protection film may be further provided to the adhesive layer(s). The protection film can be selected from those described concerning the above detachable film.

EXAMPLES

The present invention will be explained more in detail with reference to Examples hereinafter.

(PREPARATION OF LIQUID ADHESIVE)

Example 1

100 Parts by weight of a butadiene-acrylonitrile copolymer (weight average molecular weight 250,000, acrylonitrile content 27%), 50 parts by weight of a p-tert-butylphenol type resol phenolic resin (CKM-1282, supplied by SHOWA HIPOLYMER Co., LTD.), 45 parts by weight of a compound of the formula (3-1) and 5 parts by weight of 1,3-bis(3-aminopropyl)-1,1,3,3-tetramethyldisiloxane (mole equivalent of amino group per mole equivalent of maleimide groups of the above compound=0.51) were added to tetrahydrofuran, fully mixed and dissolved to give a liquid adhesive having a solid content of 30% by weight. Incidentally, liquid adhesives obtained in Examples 2 to 27 to be described later also had a solid content of 30% by weight.

Example 2

A liquid adhesive was obtained in the same manner as in Example 1 except that the amount of butadiene-acrylonitrile copolymer was changed from 100 parts by weight to 25 parts by weight.

Example 3

A liquid adhesive was obtained in the same manner as in Example 1 except that the amount of butadiene-acrylonitrile copolymer was changed from 100 parts by weight to 400 parts by weight.

Example 4

A liquid adhesive was obtained in the same manner as in Example 1 except that the amount of p-tert-butylphenol type resol phenolic resin was changed from 50 parts by weight to 20 parts by weight, that the amount of the compound of the formula (3-1) was changed from 45 parts by weight to 72 parts by weight and that the amount of 1,3-bis(3-aminopropyl)-1,1,3,3-tetramethyldisiloxane was changed from 5 parts by weight to 8 parts by weight (mole equivalent of amino group per mole equivalent of maleimide groups of the above compound=0.51).

Example 5

A liquid adhesive was obtained in the same manner as in Example 1 except that the amount of p-tert-butylphenol type resol phenolic resin was changed from 50 parts by weight to 80 parts by weight, that the amount of the compound of the formula (3-1) was changed from 45 parts by weight to 18 parts by weight and that the amount of 1,3-bis(3-aminopropyl)-1,1,3,3-tetramethyldisiloxane was changed from 5 parts by weight to 2 parts by weight (mole equivalent of amino group per mole equivalent of maleimide groups of the above compound=0.51).

Example 6

A liquid adhesive was obtained in the same manner as in Example 1 except that the amount of the compound of the formula (3-1) was changed from 45 parts by weight to 49 parts by weight and that the amount of 1,3-bis(3-aminopropyl)-1,1,3,3-tetramethyldisiloxane was changed from 5 parts by weight to 1 part by weight (mole equivalent of amino group per mole equivalent of maleimide groups of the above compound=0.09).

Example 7

A liquid adhesive was obtained in the same manner as in Example 1 except that the amount of the compound of the formula (3-1) was changed from 45 parts by weight to 41 parts by weight and that the amount of 1,3-bis(3-aminopropyl)-1,1,3,3-tetramethyldisiloxane was changed from 5 parts by weight to 9 parts by weight (mole equivalent of amino group per mole equivalent of maleimide groups of the above compound=1.01).

Example 8

A liquid adhesive was obtained in the same manner as in Example 1 except that the amount of the compound of the formula (3-1) was changed from 45 parts by weight to 40 parts by weight and that 5 parts by weight of 1,3-bis(3-aminopropyl)-1,1,3,3-tetramethyldisiloxane was replaced with 10 parts by weight of $\alpha,\omega$-bis(3-aminopropyl) polydimethylsiloxane (polymerization degree: 4) (mole equivalent of amino group per mole equivalent of maleimide groups of the above compound=0.53).

Example 9

A liquid adhesive was obtained in the same manner as in Example 1 except that the amount of the compound of the formula (3-1) was changed from 45 parts by weight to 37 parts by weight and that 5 parts by weight of 1,3-bis(3-aminopropyl)-1,1,3,3-tetramethyldisiloxane was replaced with 13 parts by weight of $\alpha,\omega$-bis(3-aminopropyl) polydimethylsiloxane (polymerization degree: 8) (mole equivalent of amino group per mole equivalent of maleimide groups of the above compound=0.51).

Example 10

A liquid adhesive was obtained in the same manner as in Example 1 except that the amount of the compound of the formula (3-1) was changed from 45 parts by weight to 43 parts by weight and that 5 parts by weight of 1,3-bis(3-aminopropyl)-1,1,3,3-tetramethyldisiloxane was replaced with 7 parts by weight of 1,3-bis(3-aminophenoxymethyl)-1,1,3,3-tetramethyldisiloxane (mole equivalent of amino group per mole equivalent of maleimide groups of the above compound=0.47).

Example 11

A liquid adhesive was obtained in the same manner as in Example 1 except that the amount of the compound of the formula (3-1) was changed from 45 parts by weight to 48.5 parts by weight and that 5 parts by weight of 1,3-bis(3-aminopropyl)-1,1,3,3-tetramethyldisiloxane was replaced with 1.5 parts by weight of ethylenediamine (mole equivalent of amino group per mole equivalent of maleimide groups of the above compound=0.53).

Example 12

A liquid adhesive was obtained in the same manner as in Example 1 except that the amount of the compound of the formula (3-1) was changed from 45 parts by weight to 48 parts by weight and that 5 parts by weight of 1,3-bis(3-aminopropyl)-1,1,3,3-tetramethyldisiloxane was replaced with 2 parts by weight of hexamethylenediamine (mole equivalent of amino group per mole equivalent of maleimide groups of the above compound=0.47).

Example 13

A liquid adhesive was obtained in the same manner as in Example 1 except that the amount of the compound of the formula (3-1) was changed from 45 parts by weight to 46 parts by weight and that 5 parts by weight of 1,3-bis(3-aminopropyl)-1,1,3,3-tetramethyldisiloxane was replaced with 4 parts by weight of 1,10-diaminodecane (mole equivalent of amino group per mole equivalent of maleimide groups of the above compound=0.58).

Example 14

A liquid adhesive was obtained in the same manner as in Example 1 except that the amount of the compound of the formula (3-1) was changed from 45 parts by weight to 46 parts by weight and that 5 parts by weight of 1,3-bis(3-aminopropyl)-1,1,3,3-tetramethyldisiloxane was replaced with 4 parts by weight of 3,4-diaminodiphenyl ether (mole equivalent of amino group per mole equivalent of maleimide groups of the above compound=0.50).

Example 15

A liquid adhesive was obtained in the same manner as in Example 1 except that the compound of the formula (3-1) was replaced with a compound of the formula (3-2). The mole equivalent of amino group of the tetramethyldisiloxane compound per mole equivalent of maleimide groups of the compound of the formula (3-2) was 0.32.

Example 16

A liquid adhesive was obtained in the same manner as in Example 1 except that the compound of the formula (3-1) was replaced with a compound of the formula (3-3). The mole equivalent of amino group of the tetramethyldisiloxane compound per mole equivalent of maleimide groups of the compound of the formula (3-3) was 0.39.

Example 17

A liquid adhesive was obtained in the same manner as in Example 1 except that the p-tert-butylphenol type resol phenolic resin (CKM-1282) was replaced with a bisphenol A type resol phenolic resin (CKM-908, supplied by SHOWA HIPOLYMER Co., LTD.).

Example 18

A liquid adhesive was obtained in the same manner as in Example 1 except that the p-tert-butylphenol type resol phenolic resin (CKM-1282) was replaced with a cresol type resol phenolic resin (BKM-2620, supplied by Showa Kobunshi K.K.).

Example 19

A liquid adhesive was obtained in the same manner as in Example 1 except that the butadiene-acrylonitrile copolymer was replaced with a butadiene-acrylonitrile copolymer having a weight average molecular weight of 60,000 and an acrylonitrile content of 10%.

Example 20

A liquid adhesive was obtained in the same manner as in Example 1 except that the butadiene-acrylonitrile copolymer was replaced with a butadiene-acrylonitrile copolymer having a weight average molecular weight of 60,000 and an acrylonitrile content of 27%.

Example 21

A liquid adhesive was obtained in the same manner as in Example 1 except that the butadiene-acrylonitrile copolymer was replaced with a butadiene-acrylonitrile copolymer having a weight average molecular weight of 60,000 and an acrylonitrile content of 40%.

Example 22

A liquid adhesive was obtained in the same manner as in Example 1 except that the butadiene-acrylonitrile copolymer was replaced with a butadiene-acrylonitrile copolymer having a weight average molecular weight of 250,000 and an acrylonitrile content of 10%.

Example 23

A liquid adhesive was obtained in the same manner as in Example 1 except that the butadiene-acrylonitrile copolymer was replaced with a butadiene-acrylonitrile copolymer having a weight average molecular weight of 250,000 and an acrylonitrile content of 40%.

Example 24

A liquid adhesive was obtained in the same manner as in Example 1 except that the butadiene-acrylonitrile copolymer was replaced with a butadiene-acrylonitrile copolymer having a weight average molecular weight of 500,000 and an acrylonitrile content of 10%.

Example 25

A liquid adhesive was obtained in the same manner as in Example 1 except that the butadiene-acrylonitrile copolymer was replaced with a butadiene-acrylonitrile copolymer having a weight average molecular weight of 500,000 and an acrylonitrile content of 27%.

Example 26

A liquid adhesive was obtained in the same manner as in Example 1 except that the butadiene-acrylonitrile copolymer was replaced with a butadiene-acrylonitrile copolymer having a weight average molecular weight of 500,000 and an acrylonitrile content of 40%.

Example 27

100 Parts by weight of the liquid adhesive obtained in Example 1 and 6 parts by weight of an alumina filler (supplied by SHOWA DENKO K.K.) were dispersion-mixed to give a liquid adhesive.

Comparative Example 1

A nylon epoxy-based adhesive (TORESINE FS-410, supplied by TEIKOKU CHEMICAL INDUSTRY Co., Ltd., solid content 20%, solvent=isopropyl alcohol:methyl ethyl ketone=2:1) was prepared.

Comparative Example 2

A solution of 20% by weight of a polyimide-containing varnish (LARC TPI, supplied by MITSUI TOATSU CHEMICALS, INC.) in N-methylpyrrolidone was prepared.

(Preparation of Adhesive Tape)

Adhesive tapes were prepared from the liquid adhesives obtained in Examples 1 to 27 as follows. The liquid adhesive was applied to each surface of a polyimide film such that a dry adhesive layer on each surface had a thickness of 20 μm, and dried in a hot air circulating dryer at 160° C. for 5 minutes. The so-obtained adhesive tapes will be referred to as adhesive tapes of Examples 1 to 27, and adhesive tapes obtained from adhesives obtained in other Examples or Comparative Examples will be also referred to as "adhesive tapes of Examples or Comparative Examples" hereinafter.

(Preparation of Comparative Adhesive Tape 1)

The adhesive in Comparative Example 1 was applied to each surface of a polyimide film such that a dry adhesive layer on each surface had a thickness of 20 μm, and dried in a hot air circulating dryer at 150° C. for 15 minutes, to obtain an adhesive tape.

(Preparation of Comparative Adhesive Tape 2)

The adhesive in Comparative Example 2 was applied to each surface of a polyimide film such that a dry adhesive layer on each surface had a thickness of 20 μm, and dried in a hot air circulating dryer at 150° C. for 120 minutes and at 250° C. for 60 minutes, to obtain an adhesive tape.

(Assembling of Lead Frame)

A lead frame used for a semiconductor package shown in FIG. 1 was assembled in the following procedures under working conditions shown in Table 1.

(a) Punching of Adhesive Tape

An adhesive tape was punched out in the form of a ring with a die.

(b) Temporary Bonding of Adhesive Tape

A plane was placed on a hot plate, and the tape punched out in the form of a ring was pressed on the plane with a metal rod for temporary bonding. The adhesive layer was heat-melted under conditions shown in Table 1 for bonding.

(c) Assembling of Lead Frame

The plane with the adhesive tape temporarily bonded in the above step and a lead frame part were positioned, heated and pressurized on a hot plate to bond the lead frame and the plane through the adhesive tape. The adhesive layer was heat-melted under conditions shown in Table 1 for bonding.

(d) Curing of Adhesive Tape

In Examples 1 to 27 and Comparative Example 1, each set was placed in a hot air circulating oven from which air was purged with nitrogen, and heat-cured under conditions shown in Table 1. It was because each adhesive tape was different from every other one in tape properties that the bonding conditions and the curing conditions were different. Optimum bonding conditions were selected for each adhesive tape, and each adhesive layer was cured under such conditions.

TABLE 1

|  | Temporary bonding | Lead frame assembly | Curing of adhesive tape |
| --- | --- | --- | --- |
| Adhesive tapes of Examples 1 to 27 | 140° C. / 2 seconds / 4 kgf/cm² | 140° C. / 2 seconds / 4 kgf/cm² | 200° C. / 1 hour |
| Adhesive tape of Comparative Example 1 | 80° C. / 2 seconds / 4 kgf/cm² | 120° C. / 2 seconds / 4 kgf/cm² | 150° C. / 3 hours |
| Adhesive tape of Comparative Example 2 | 350° C. / 10 seconds / 4 kgf/cm² | 350° C. / 15 seconds / 20 kgf/cm² | Nil |

(Assembling of Semiconductor Package)

The above-obtained lead frames were used, and semiconductor packages were assembled in the following procedures.

(a) Die-bonding

A semiconductor chip was bonded to the plane portion with a die bonding silver paste and cured at 150° C. for 2 hours.

(b) Wire bonding

A wire pad on the semiconductor chip and a silver plated portion on an inner lead wire end portion were connected with a gold wire with a wire bonder.

(c) Molding

The above-obtained set was transfer-molded with an epoxy-containing molding agent.

(d) Finish step

The steps of forming, die cutting and outer lead portion plating were carried out to complete a package.

(Results of Evaluation of Adhesive Tape in Assembling of Lead Frame)

(a) Taping-feasible temperature

An adhesive tape was evaluated concerning whether or not it could be easily and readily bonded to an adherend such as a plane or lead pins. Specifically, the adhesive tape was measured for a temperature range in which it could be bonded to a lead frame with a taping machine.

The results were as follows. The adhesive tapes of the present invention and the adhesive tape of Comparative Example 1 could be bonded in the temperature range of from 100° to 240° C., while the adhesive tape of Comparative Example 2 required a temperature higher than 350° C. for its bonding.

(b) Oxidation of lead frame

A lead frame surface was visually observed for a change in color to determine whether or not the lead frame surface underwent oxidation during the curing of the adhesive.

The results were as follows. The adhesive tapes of the present invention did not undergo oxidation. On the other hand, the bonding temperature of the adhesive tape of Comparative Example 2 was extremely high and required a long period of time for its bonding, and the lead frame surface showed a change in color or the oxidation took place.

(c) Voids

When an adhesive was cured, the adhesive was visually evaluated through an electron microscope to determine whether or not voids taking place in the adhesive were at a level where the voids caused a problem in practical use.

The results were as follows. The adhesive tapes of the present invention caused no voids, while the adhesive tape of Comparative Example 1 showed the occurrence of voids.

(d) Workability

An adhesive tape was evaluated for handling properties (curling and running performance) and tackiness on the adhesive surface during its use such as taping of the adhesive tape during the assembling of a lead frame.

The results were as follows. The adhesive tapes of the present invention were all excellent in handling properties and had no surface tackiness, while the adhesive tape of Comparative Example 2 caused problems in handling properties.

(e) Wire bondability

When a package was assembled, an adhesive tape was evaluated for wire bondability with a gold wire to a lead frame.

The results were as follows. When the adhesive tapes of the present invention were used, no bonding failure occurred in a test using 832 pins, while the adhesive tape of Comparative Example 1 showed a bonding failure of 123 pins out of the 832 pins and failed to bond the gold wire in sufficient strength.

(f) Evaluation of semiconductor package

A package obtained as described above was subjected to a PCBT (pressure cooker biased test). PCBT was carried out at a voltage of 5 V at 121° C. under a pressure of 2 atm at 100% RH for evaluating the electrical reliability of an adhesive tape.

The results were as follows. When the adhesive tapes of the present invention were used, no short circuit occurred for 1,000 hours. When the adhesive tape of Comparative Example 1 was used, a short circuit occurred before a 1,000 hour period passed.

(Evaluation of Adhesive Tape for Strength)

An adhesive tape was bonded to a copper plate at 150° C. (taping), and then measured for a 90° peel strength at room temperature.

The results were as follows. The adhesive tapes of the present invention showed a 90° peel strength of 300 to 470 g/10 mm, while the adhesive tape of Comparative Example 1 showed a low 90° peel strength, as low as 2 to 4 g/10 mm, and the adhesive tape of Comparative Example 2 showed a large variability of 10 to 40 g/10 mm in 90° peel strength.

As is clearly shown in the above results, the adhesive tape of the present invention to which the liquid adhesive of the present invention is applied serves to produce excellent semiconductor packages. In contrast, the comparativeadhesivetapeshadthefollowingproblems. A lead frame is oxidized, the bonding conditions are not suitable for the assembling of a lead frame, or the wire bonding with a gold wire is not admitted. Therefore, the comparative adhesive tapes are not suitable for producing electronic parts.

The liquid adhesive of the present invention can be used for bonding and cured at relatively low temperatures and has sufficient heat resistance and reliability. The adhesive tape of the present invention to which the above liquid adhesive is applied can be suitably used for bonding one member to another member of lead frame peripheral parts which constitute a semiconductor device, such as a lead pin, a semiconductor chip mounting substrate, a radiator, a semiconductor chip itself.

Example 28

100 Parts by weight of a butadiene-acrylonitrile copolymer (weight average molecular weight 250,000, acrylonitrile content 27%), 25 parts by weight of a p-tert-butylphenol type resol phenolic resin (CKM-1282, supplied by SHOWA HIPOLYMER CO., Ltd.), 25 parts by weight of a novolak type epoxy resin (EOCN-1020, supplied by NIPPON KAY- AKU CO., LTD.), 45 parts by weight of a compound of the formula (3-1) and 5 parts by weight of 1,3-bis(3-aminopropyl)-1,1,3,3-tetramethyldisiloxane (n=0, mole equivalent of amino groups per mole equivalent of maleimide groups of the above compound=0.51) were added to tetrahydrofuran, fully mixed and dissolved to give a liquid adhesive having a solid content of 30% by weight. Incidentally, liquid adhesives obtained in Examples 29 to 51 and Comparative Examples 3 to 6 to be described later also had a solid content of 30% by weight.

Example 29

A liquid adhesive was obtained in the same manner as in Example 28 except that the amount of butadiene-acrylonitrile copolymer was changed from 100 parts by weight to 25 parts by weight.

Example 30

A liquid adhesive was obtained in the same manner as in Example 28 except that the amount of butadiene-acrylonitrile copolymer was changed from 100 parts by weight to 400 parts by weight.

Example 31

A liquid adhesive was obtained in the same manner as in Example 28 except that the amount of each of p-tert-butylphenol type resol phenolic resin and novolak type epoxy resin was changed from 25 parts by weight to 10 parts by weight, that the amount of the compound of the formula (3-1) was changed from 45 parts by weight to 72 parts by weight and that the amount of 1,3-bis(3-aminopropyl)-1,1,3,3-tetramethyldisiloxane was changed from 5 parts by weight to 8 parts by weight (mole equivalent of amino group per mole equivalent of maleimide groups of the above compound=0.51).

Example 32

A liquid adhesive was obtained in the same manner as in Example 28 except that the amount of each of p-tert-butylphenol type resol phenolic resin and novolak type epoxy resin was changed from 25 parts by weight to 40 parts by weight, that the amount of the compound of the formula (3-1) was changed from 45 parts by weight to 18 parts by weight and that the amount of 1,3-bis(3-aminopropyl)-1,1,3,3-tetramethyldisiloxane was changed from 5 parts by weight to 2 parts by weight (mole equivalent of amino group per mole equivalent of maleimide groups of the above compound=0.51).

Example 33

A liquid adhesive was obtained in the same manner as in Example 28 except that the amount p-tert-butylphenol type resol phenolic resin was changed from 25 parts by weight to 10 parts by weight and that the amount of novolak type epoxy resin was changed from 25 parts by weight to 40 parts by weight.

Example 34

A liquid adhesive was obtained in the same manner as in Example 28 except that the amount p-tert-butylphenol type resol phenolic resin was changed from 25 parts by weight to 40 parts by weight and that the amount of novolak type epoxy resin was changed from 25 parts by weight to 10 parts by weight.

Example 35

A liquid adhesive was obtained in the same manner as in Example 28 except that the amount of the compound of the formula (3-1) was changed from 45 parts by weight to 49 parts by weight and that the amount of 1,3-bis(3-aminopropyl)-1,1,3,3-tetramethyldisiloxane was changed from 5 parts by weight to 1 part by weight (mole equivalent of amino group per mole equivalent of maleimide groups of the above compound=0.09).

Example 36

A liquid adhesive was obtained in the same manner as in Example 1 except that the amount of the compound of the formula (3-1) was changed from 45 parts by weight to 41 parts by weight and that the amount of 1,3-bis(3-aminopropyl)-1,1,3,3-tetramethyldisiloxane was changed from 5 parts by weight to 9 parts by weight (mole equivalent of amino group per mole equivalent of maleimide groups of the above compound=1.01).

Example 37

A liquid adhesive was obtained in the same manner as in Example 28 except that the amount of the compound of the formula (3-1) was changed from 45 parts by weight to 37 parts by weight and that 5 parts by weight of 1,3-bis(3-aminopropyl)-1,1,3,3-tetramethyldisiloxane was replaced with 13 parts by weight of α,ω-bis(3-aminopropyl)-polydimethylsiloxane (n=7, mole equivalent of amino group per mole equivalent of maleimide groups of the above compound =0.51).

Example 38

A liquid adhesive was obtained in the same manner as in Example 28 except that the amount of the compound of the formula (3-1) was changed from 45 parts by weight to 43 parts by weight and that 5 parts by weight of 1,3-bis(3-aminopropyl)-1,1,3,3-tetramethyldisiloxane was replaced with 7 parts by weight of 1,3-bis(3-aminophenoxymethyl)-1,1,3,3-tetramethyldisiloxane (n=0, mole equivalent of amino group per mole equivalent of maleimide groups of the above compound=0.47).

Example 39

A liquid adhesive was obtained in the same manner as in Example 28 except that the amount of the compound of the formula (3-1) was changed from 45 parts by weight to 48 parts by weight and that 5 parts by weight of 1,3-bis(3-aminopropyl)-1,1,3,3-tetramethyldisiloxane was replaced with 2 parts by weight of hexamethylenediamine (mole equivalent of amino group per mole equivalent of maleimide groups of the above compound=0.47).

Example 40

A liquid adhesive was obtained in the same manner as in Example 28 except that the amount of the compound of the formula (3-1) was changed from 45 parts by weight to 46 parts by weight and that 5 parts by weight of 1,3-bis(3-aminopropyl)-1,1,3,3-tetramethyldisiloxane was replaced with 4 parts by weight of 3,4-diaminodiphenyl ether (mole equivalent of amino group per mole equivalent of maleimide groups of the above compound=0.50).

Example 41

A liquid adhesive was obtained in the same manner as in Example 28 except that the compound of the formula (3-1)

was replaced with a compound of the formula (3-2). The mole equivalent of amino group of the 1,3-bis(3-aminopropyl)-1,1,3,3-tetramethyldisiloxane compound per mole equivalent of maleimide groups of the compound of the formula (3-2) was 0.32.

Example 42

A liquid adhesive was obtained in the same manner as in Example 28 except that the compound of the formula (3-1) was replaced with a compound of the formula (3-3). The mole equivalent of amino group of the 1,3-bis(3-aminopropyl)-1,1,3,3-tetramethyldisiloxane compound per mole equivalent of maleimide groups of the compound of the formula (3-3) was 0.39.

Example 43

A liquid adhesive was obtained in the same manner as in Example 28 except that the novolak type epoxy resin was replaced with a bisphenol S type epoxy resin (EBPS-300, supplied by NIPPON KAYAKU CO., LTD.)

Example 44

A liquid adhesive was obtained in the same manner as in Example 28 except that the novolak type epoxy resin was replaced with a biphenyl type epoxy resin (YX4000H, supplied by YUKA SHELL EPOXY K.K.).

Example 45

A liquid adhesive was obtained in the same manner as in Example 28 except that the p-tert-butylphenol type resol phenolic resin was replaced with a bisphenol A type resol phenolic resin (CKM-908, supplied by SHOWA HIPOLYMER CO., LTD.).

Example 46

A liquid adhesive was obtained in the same manner as in Example 28 except that the p-tert-butylphenol type resol phenolic resin was replaced with a cresol type resol phenolic resin (BKM-2620, supplied by SHOWA HIPOLYMER CO., LTD.).

Example 47

A liquid adhesive was obtained in the same manner as in Example 28 except that the butadiene-acrylonitrile copolymer was replaced with a butadiene-acrylonitrile copolymer having a weight average molecular weight of 60,000 and an acrylonitrile content of 27%.

Example 48

A liquid adhesive was obtained in the same manner as in Example 28 except that the butadiene-acrylonitrile copolymer was replaced with a butadiene-acrylonitrile copolymer having a weight average molecular weight of 250,000 and an acrylonitrile content of 10%.

Example 49

A liquid adhesive was obtained in the same manner as in Example 28 except that the butadiene-acrylonitrile copolymer was replaced with a butadiene-acrylonitrile copolymer having a weight average molecular weight of 250,000 and an acrylonitrile content of 40%.

Example 50

A liquid adhesive was obtained in the same manner as in Example 28 except that the butadiene-acrylonitrile copolymer was replaced with a butadiene-acrylonitrile copolymer having a weight average molecular weight of 500,000 and an acrylonitrile content of 27%.

Example 51

100 Parts by weight of the liquid adhesive obtained in Example 28 and 6 parts by weight of an anhydrous silica having an average particle diameter of 0.04 μm (trade name TT-600, supplied by NIPPONAEROSIL CO., LTD.) as a filler were dispersion-mixed to give a liquid adhesive.

Comparative Example 3

A liquid adhesive was obtained in the same manner as in Example 28 except that the amount of p-tert-butylphenol type resol phenolic resin was changed to 100 parts by weight and that the compound of the formula (3-1) and 1,3-bis(3-aminopropyl)-1,1,3,3-tetramethyldisiloxane were not used.

Comparative Example 4

100 Parts by weight of the same butadiene-acrylonitrile copolymer as that used in Example 28, 45 parts by weight of a novolak type phenoxy resin (CKM-2400, supplied by SHOWAHIPOLYMERCO., LTD.), 55 parts byweight of abisphenol A type epoxy resin (Epikote 828, supplied by YUKA SHELL EPOXY K.K.) and 0.5 parts byweight of triphenyl phosphinewere added to tetrahydrofuran, fully mixed and dissolved to give a liquid adhesive having a solid content of 30% by weight.

(Preparation of Adhesive Tape)

Adhesive tapes were prepared from the liquid adhesives obtained in Examples 28 to 51 as follows. The liquid adhesive was applied to each surface of a polyimide film such that a dry adhesive layer on each surface had a thickness of 20 μm, and dried in a hot air circulating dryer at 160° C. for 5 minutes.

Adhesive tapes were also prepared from the adhesives obtained in Comparative Examples 3 and 4 in the same manner as above.

(Assembling of Lead Frame)

Figure 2:
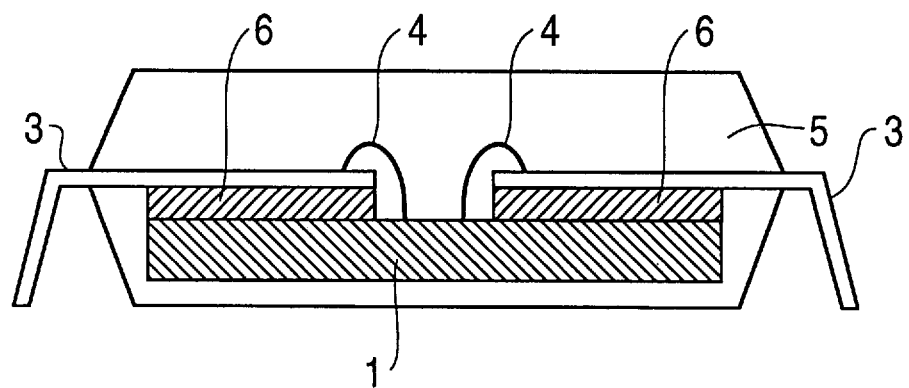
FIG. 2 is a cross-sectional view of another plastic-sealed semiconductor device to which the adhesive tape of the present invention or a conventional adhesive tape is applied.
Figure 3:
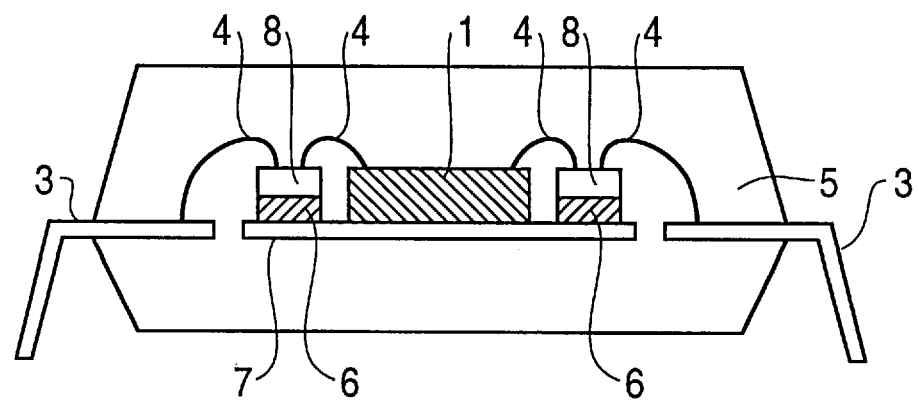
FIG. 3 is a cross-sectional view of still another plastic-sealed semiconductor device to which the adhesive tape of the present invention or a conventional adhesive tape is applied.

A lead frame used for a semiconductor package as shown in FIG. 2 were assembled in the same manner as in Examples 1 to 27 under working conditions shown in Table 2.

TABLE 2

| | Temporary bonding | Lead frame assembly | Curing of adhesive tape |
|---|---|---|---|
| Adhesive tapes of Examples 28 to 51 | 140° C. / 2 seconds / 4 kgf/cm² | 140° C. / 2 seconds / 4 kgf/cm² | 200° C. / 1 hour |
| Adhesive tapes of Comparative Examples 3 and 4 | 140° C. / 2 seconds / 4 kgf/cm² | 140° C. / 2 seconds / 4 kgf/cm² | 150° C. / 3 hours |

(Assembling of Semiconductor Package)

The above-obtained lead frames were used, and semiconductor packages were assembled in the same procedures as those in Examples 1 to 27.

(Results of Evaluation of Adhesive Tape in Assembling of Lead Frame)

(a) Taping-feasible temperature

The adhesive tapes were evaluated in the same manner as in Examples 1 to 27. The results were as follows.

The adhesive tapes of Examples 28 to 51 and the adhesive tapes of Comparative Examples 3 and 4 could be bonded in the temperature range of from 100° to 240° C.

(b) Oxidation of lead frame

The lead frame were visually observed in the same manner as in Examples 1 to 27. The results were as follows.

The adhesive tapes of Examples 28 to 51 and the adhesive tape of Comparative Example 3 did not cause a color change in the lead frames. The adhesive tape of Comparative Example 4 caused a color change in the lead frame due to a volatile component.

(c) Voids

The adhesive was visually evaluated in the same manner as in Examples 1 to 27. The results were as follows.

The adhesive tapes of Examples 28 to 51 and the adhesive tape of Comparative Example 4 caused no voids, while the adhesive tape of Comparative Example 3 showed the occurrence of voids.

(d) Workability

The adhesive tapes were evaluated for handling properties (curling and running performance) and tackiness in the same manner as in Examples 1 to 27. The results were as follows.

The adhesive tapes of Examples 28 to 51 were all excellent in handling properties and had no surface tackiness, while the adhesive tape of Comparative Example 4 caused problems in handling properties.

(e) Wire bondability

When the packages were assembled, the adhesive tapes were evaluated for wire bondability in the same manner as in Examples 1 to 27. The results were as follows.

When the adhesive tapes of Examples 28 to 51 and the adhesive tapes of Comparative Examples 3 and 4 were used, no bonding failure occurred in a test using 832 pins.

(f) Evaluation of semiconductor package

The packages obtained as described above were subjected to a PCBT (pressure cooker biased test) in the same manner as in Examples 1 to 27 to evaluate the electrical reliability of each adhesive tape. The results were as follows.

When the adhesive tapes of Examples 28 to 51 and the adhesive tape of Comparative Example 3 were used, no short circuit occurred for 1,000 hours. When the adhesive tape of Comparative Example 4 was used, a short circuit occurred before a 1,000 hour period passed.

(Evaluation of Adhesive Tape for Strength)

The adhesive tapes were evaluated for peel strength in the same manner as in Examples 1 to 27. The results were as follows.

The adhesive tapes of Examples 28 to 51 showed a 90° peel strength of 540 to 830 g/10 mm, while the adhesive tapes of Comparative Examples 3 and 4 showed a low 90° peel strength, as low as 300 to 400 g/10 mm. That is, the adhesive tapes of the present invention had a higher adhesion strength.

As is clearly shown in the above results, the adhesive tape of the present invention to which the liquid adhesive of the present invention is applied serves to produce excellent semiconductor packages, and the liquid adhesive of the present invention has sufficient adhesion strength. In contrast, the comparative adhesive tapes had the following problems. A lead frame is changed in color, the bonding conditions are not suitable for the assembling of a lead frame, or the wire bonding with a gold wire is not admitted. Further, the adhesion strength is low.

Comparative Example 5

25 Parts by weight of a butadiene-acrylonitrile copolymer (weight average molecular weight 250,000, acrylonitrile content 27%), 25 parts by weight of a p-tert-butylphenol type resol phenolic resin (CKM-1282, supplied by Showa Kobunshi K.K.) and 25 parts by weight of a novolak type epoxy resin (EOCN-1020, supplied by Nippon Kayaku K.K.) were treated in the same manner as in Example 28, to obtain a liquid adhesive.

Comparative Example 6

25 Parts by weight of a butadiene-acrylonitrile copolymer (weight average molecular weight 250,000, acrylonitrile content 27%) and 50 parts by weight of a p-tert-butylphenol type resol phenolic resin (CKM-1282, supplied by Showa Kobunshi K.K.) were treated in the same manner as in Example 28, to obtain a liquid adhesive.

(Preparation of Adhesive Tape)

An adhesive tape was prepared from the liquid adhesive obtained in Example 29 as follows. The liquid adhesive was applied to one surface of a polyimide film such that a dry adhesive layer on the surface had a thickness of 20 $\mu$m, and dried in a hot air circulating dryer at 160° C. for 5 minutes.

(Preparation of Comparative Adhesive Tape)

The adhesive in Comparative Example 1 was applied to one surface of a polyimide film such that a dry adhesive layer on the surface had a thickness of 20 $\mu$m, and dried in a hot air circulating dryer at 150° C. for 15 minutes, to obtain an adhesive tape.

(Preparation of Comparative Adhesive Tape)

The adhesive in Comparative Example 2 was applied to one surface of a polyimide film such that a dry adhesive layer on the surface had a thickness of 20 $\mu$m, and dried in a hot air circulating dryer at 150° C. for 120 minutes and at 250° C. for 60 minutes, to obtain an adhesive tape.

(Preparation of Comparative Adhesive Tapes)

Each of the adhesives in Comparative Examples 5 and 6 was individually applied to one surface of a polyimide film such that a dry adhesive layer on the surface had a thickness of 20 $\mu$m, and dried in a hot air circulating dryer at 160° C. for 5 minutes, to obtain adhesive tapes.

(Assembling of Lead Frame)

Figure 4:
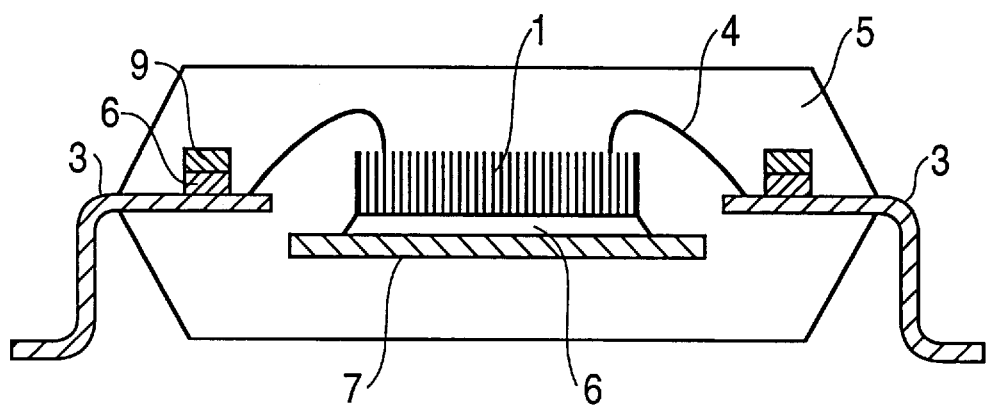
FIG. 4 is a cross-sectional view of yet another plastic-sealed semiconductor device to which the adhesive tape of the present invention or a conventional adhesive tape is applied.

A lead frame used for a semiconductor package shown in FIG. 4 was assembled in the following procedures under working conditions shown in Table 3.

(a) Punching of Adhesive Tape

An adhesive tape was punched out in the form of a ring with a die.

(b) Assembling of Lead Frame

A lead frame was placed on a hot plate, and the adhesive tape punched out in the form of a ring was positioned to meet the lead frame, and bonded thereto under heat and pressure with a metal rod.

(c) Curing of Adhesive Tape

The adhesive each of the adhesive tapes of Comparative Examples 5 and 6 was cured in the same manner as in Example 29.

TABLE 3

|  | Lead frame assembly | Curing of adhesive tape |
|---|---|---|
| Adhesive tape of Example 29 | 140° C. / 2 seconds / 4 kgf/cm$^2$ | 200° C. / 1 hour |
| Adhesive tapes of Comparative Examples 5 and 6 | 140° C. / 2 seconds / 4 kgf/cm$^2$ | 200° C. / 1 hour |
| Adhesive tape of Comparative Example 1 | 120° C. / 2 seconds / 4 kgf/cm$^2$ | 150° C. / 3 hours |
| Adhesive tape of | 350° C. / 15 | Nil |

TABLE 3-continued

| | Lead frame assembly | Curing of adhesive tape |
|---|---|---|
| Comparative Example 2 | | seconds / 20 kgf/cm² |

(Assembling of Semiconductor Package)

The above-obtained lead frames were used, and semiconductor packages were assembled in the following procedures.

(a) Die-bonding

A semiconductor chip was bonded to the die pad portion of the lead frame with a die bonding paste, and the paste was cured at 150° C. for 2 hours. Thereafter, the procedures from the wire bonding steps to the finish step in "Assembling of Semiconductor Package" in Examples 29 were repeated in the same manner as in Examples 1 to 27.

(Results of Evaluation of Adhesive Tapes of Comparative Examples 5 and 6)

Concerning the taping-feasible temperature, voids, workability, wire bondability and ,PCBT test, the adhesive tapes of Comparative Examples 5 to 6 showed results similar to those of the adhesive tapes of Example 29. However, the adhesive tapes of Comparative Examples 5 and 6 caused a color change in the lead frame due to a volatile component.

After cured, the adhesive tapes were allowed to stand at a temperature of 250° C. which was a wire bonding temperature for 1 hour, and measured for a weight loss. The results were as follows. The adhesive tape of Example 29 showed a weight loss of 1.0%. on the other hand, the adhesive tapes of Comparative Examples 1, 2, 5 and 6 showed a weight loss of 5%, 0.2%, 3.0% and 2.7%, respectively.

The adhesive tape of Example 29 and the adhesive tape of Comparative Example 2 showed small outgas amounts as compared with the adhesive tapes of Comparative Examples 1, 5 and 6.

The liquid adhesive of the present invention can be used for bonding and cured at relatively low temperatures and has sufficient heat resistance and reliability. The adhesive tape of the present invention to which the above liquid adhesive is applied can be suitably used for bonding one member to another member of lead frame peripheral parts which constitute a semiconductor device, such as a lead pin, a semiconductor chip mounting substrate, a radiator, a semiconductor chip itself.

What is claimed is:

1. An adhesive for electronic parts, which is a liquid adhesive obtained by dissolving an acrylonitrile-butadiene copolymer as Component (a), a phenolic resin as Component (b), a compound having at least 2 maleimide groups as Component (C) and a diamine compound of the general formula (1),

$$H_2N-R^1-NH_2 \tag{1}$$

wherein $R^1$ is a divalent aliphatic, aromatic or alicyclic group and/or a polysiloxane compound terminating with an amino group at each terminal, having a weight average molecular weight of 200 to 7,000 and having the general formula (2),

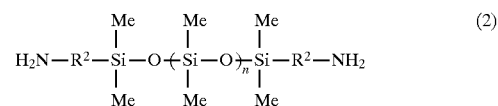

wherein $R^2$ is a divalent aliphatic, aromatic or alicyclic group and n is an integer of 0 to 7, as Component (d) in an organic solvent, and in which the total amount of Components (b), (c) and (d) per 100 parts by weight of Component (a) is 10 to 900 parts by weight, the amount of Component (b) based on the total amount of Components (b), (c) and (d) is 10 to 90% by weight, and the amount of amino groups of Component (d) per mole equivalent of the maleimide groups of Component (c) is 0.01 to 2.0 mole equivalents.

2. A liquid adhesive according to claim 1, wherein the liquid adhesive further contains an epoxy resin as Component (e), in which the total amount of Components (b), (c), (d) and (e) per 100 parts by weight of Component (a) is 10 to 900 parts by weight, the total amount of Components (b) and (e) based on the total amount of Components (b), (c), (d) and (e) is 10 to 90% by weight, and the amount of amino groups of Component (d) per mole equivalent of the maleimide groups of Component (c) is 0.01 to 2.0 mole equivalents.

3. A liquid adhesive according to claim 1, wherein the acrylonitrile-butadiene copolymer as Component (a) has a weight average molecular weight of 50,000 to 1,000,000 and an acrylonitrile content of 5 to 50% by weight.

4. A liquid adhesive according to claim 1, wherein the phenolic resin as Component (b) is a p-tert-butylphenol phenolic resin, a bisphenol A phenolic resin or a cresol phenolic resin of which the phenol component is at least one selected from the group consisting of p-tert-butylphenol, bisphenol A and cresol, or a resol phenolic resin obtained by co-condensation of these.

5. A liquid adhesive according to claim 1, wherein the compound having at least 2 maleimide groups as Component (c) is selected from compounds of the following formulae (3-1) to (3-6),

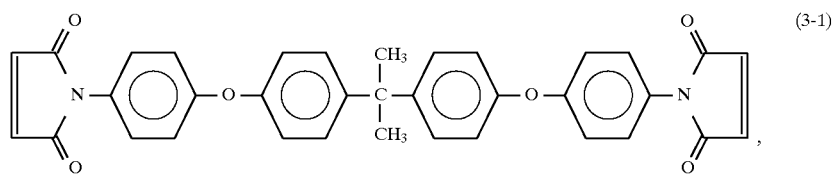

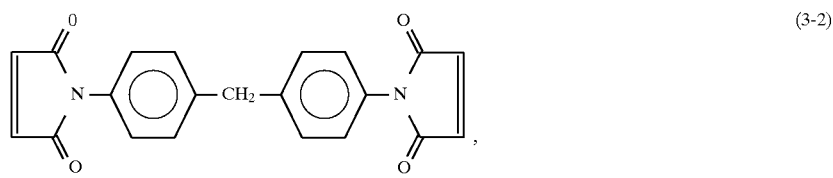

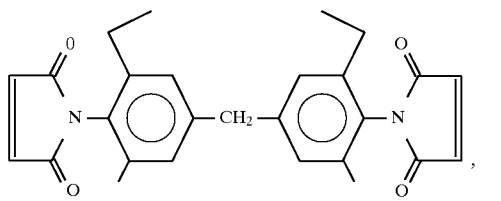
(3-3)

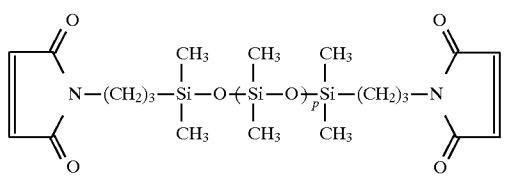
(3-4)

in which p is an integer of 0 to 7,

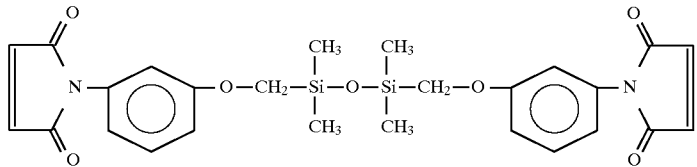
(3-5)

or

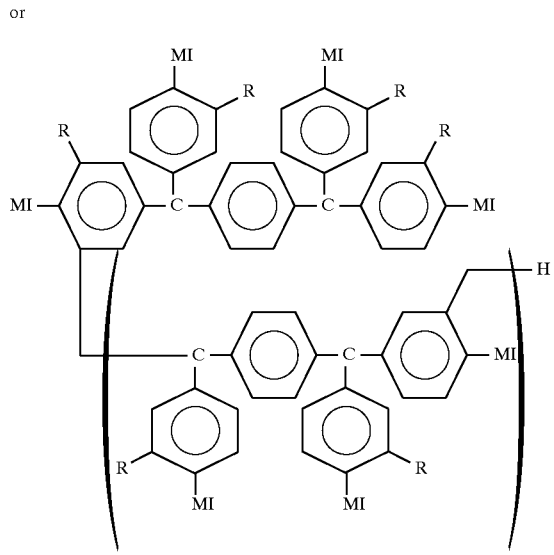
(3-6)

in which

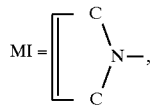

R=H or CH$_3$, and r=1~5.

6. A liquid adhesive according to claim 2, wherein the epoxy resin as Component (e) is at least one selected from the group consisting of a novolak epoxy resin, a bisphenol epoxy resin, a bisphenol epoxy resin and a biphenyl epoxy resin.

7. A liquid adhesive according to claim 1, wherein the liquid adhesive further contains 4 to 40% by weight, based on a total solid content, of a filler having a particle diameter of 1 μm or less.

8. An adhesive tape for electronic parts, which has an adhesive layer formed by applying the liquid adhesive recited in claim 1 to at least one surface of a heat-resistant film and drying the liquid adhesive.

9. An adhesive tape according to claim 8, wherein the heat-resistant film is a polyimide film.

10. An adhesive tape for electronic parts, which has an adhesive layer formed by applying the liquid adhesive recited in claim 1 to at least one surface of a detachable film and drying the liquid adhesive.

* * * * *